(12) United States Patent
Nakazima et al.

(10) Patent No.: US 6,365,824 B1
(45) Date of Patent: Apr. 2, 2002

(54) ROOF TILE-CUM-SOLAR BATTERY MODULE

(75) Inventors: Ichiro Nakazima, Nara; Teruki Hatsukaiwa, Otsu; Fumihiro Tanigawa, Settsu, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/619,914

(22) Filed: Jul. 19, 2000

(30) Foreign Application Priority Data

Jul. 21, 1999 (JP) .......................................... 11-206199
Jul. 21, 1999 (JP) .......................................... 11-206200

(51) Int. Cl.[7] ........................ H01L 31/048; E04D 13/18
(52) U.S. Cl. .................. 136/251; 136/244; 136/291; 52/173.3; 52/91.3; 52/519; 52/522
(58) Field of Search ................................. 136/251, 244, 136/291; 52/173.3, 91.3, 519, 522

(56) References Cited

U.S. PATENT DOCUMENTS 4,189,881 A * 2/1980 Hawley ....................... 136/251
4,636,577 A * 1/1987 Peterpaul ..................... 136/251
5,573,600 A * 11/1996 Hoang ......................... 136/248
5,706,617 A * 1/1998 Hirai et al. .................. 136/251
5,768,831 A * 6/1998 Melchoir ..................... 136/251
6,201,179 B1 * 3/2001 Dalacu ........................ 136/251

FOREIGN PATENT DOCUMENTS

| EP | 1071138 A2 * | 1/2001 |
| EP | 1071139 A2 * | 1/2001 |
| JP | 10-018515 | 1/1998 |
| JP | 10-088741 | 4/1998 |

* cited by examiner

*Primary Examiner*—Alan Diamond
(74) *Attorney, Agent, or Firm*—Hogan & Hartson, L.L.P.

(57) ABSTRACT

A tile for attaching a solar battery module to the roof of a house comprises a substantially rectangular plate-like tile body. The upper surface of the tile body has a plurality of projecting portions and depressed portions alternately extending over the entire length of the tile in a direction of inclination of the roof. The upper surface of the tile body also has a recess for receiving the solar battery module. The recess has a bottom portion to be brought into contact with the reverse surface of the solar battery module. The recess also has a plurality of stop portions to be brought into contact with edge portions of the solar battery module to hold them.

17 Claims, 4 Drawing Sheets

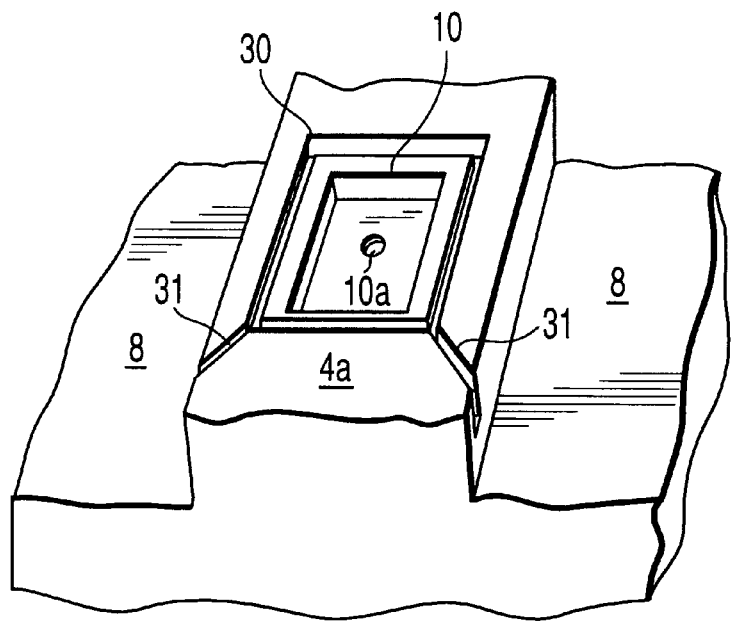
F I G. 3
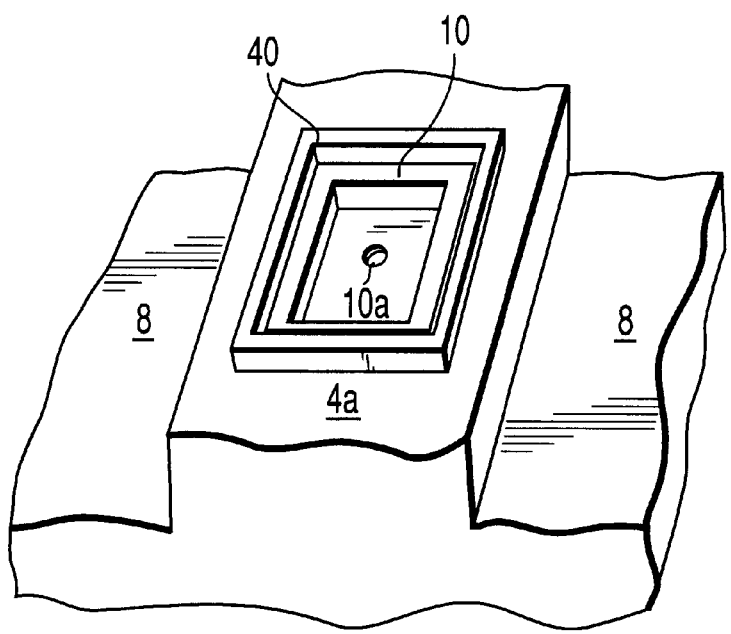
F I G. 4

ROOF TILE-CUM-SOLAR BATTERY MODULE

CROSS-REFERENCE TO RELATED APPLICATIONS

This application is based upon and claims the benefit of priority from the prior Japanese Patent Applications No. 11-206199, filed Jul. 21, 1999; and No. 11-206200, filed Jul. 21, 1999, the entire contents of which are incorporated herein by reference.

BACKGROUND OF THE INVENTION

This invention relates to a roof tile for attaching, to the roof of a house, a solar battery module for subjecting sunlight to photoelectric conversion, and also to a roof tile-cum-solar battery module.

Japanese Patent Application KOKAI Publication No. 10-88741, for example, discloses a technique for mounting a solar battery module on a tile attached to the roof of a house or a building, for using solar energy by converting it into electric energy.

More specifically, this publication discloses a roof tile-cum-solar battery module, which has a substantially flat tile body provided with a solar battery module in a recess formed in its upper surface. A plurality of holes are formed in the recess of the tile body such that they extend to the lower surface of the tile body. Rainwater, leaking into the recess, through caulking provided between the solar battery module and the recess for protecting the module from water, is guided to the reverse side of the tile body through the holes.

However, when rainwater is collected in the recess for a long time because of, for example, degradation of caulking, it is possible that connecting terminals attached to the reverse surface of the solar battery module will get wet.

Furthermore, since, in the above-described structure, rainwater leaking into the recess is guided to the lower or reverse surface of the tile body, it is possible that the roofing board of a house, which is covered with such tile bodies, will get wet and corrode.

BRIEF SUMMARY OF THE INVENTION

The present invention has been developed in light of the above problem, and aims to provide a tile for a solar battery module, which does not require any caulking between a solar battery module and a tile body to protect the connecting terminals of the module or the tile board of a roof from rainwater, and also to provide a tile-cum-solar battery module.

According to a first aspect of the invention, there is provided a tile mounted on an inclined roof of a building, comprising:

a tile body having a plurality of projecting portions and a plurality of depressed portions alternately extending over an entire length of the tile in a direction of inclination of the inclined roof; and a recess formed in at least one of the projecting portions of the tile body for receiving a solar battery module, the recess including a bottom portion to be brought into contact with a reverse surface of the solar battery module, and at least one stop portion to be brought into contact with an edge portion of the solar battery module to hold it, the bottom portion being at a lower level than the projecting portions and at a higher level than the depressed portions.

According to a second aspect of the invention, there is provided a tile mounted on an inclined roof of a building, comprising:

a plurality of projecting portions extending over an entire length of the tile in a direction of inclination of the inclined roof;

a plurality of depressed portions each interposed between each pair of adjacent ones of the projecting portions, the depressed portions each having opposite ends opening at an upper end and a lower end of the tile, the depressed portions serving as drain passages for downwardly discharging rainwater in the direction of inclination of the roof; and an accommodating recess formed in one of the projecting portions for accommodating a terminal box projecting from a reverse surface of the solar battery module.

According to a third aspect of the invention, there is provided a tile-cum-solar battery module mounted on an inclined roof of a building, comprising:

a tile body having a plurality of projecting portions and a plurality of depressed portions alternately extending over an entire length of the tile in a direction of inclination of the inclined roof, the depressed portions each having opposite ends opening at an upper end and a lower end of the tile, the depressed portions serving as drain passages for downwardly discharging rainwater in the direction of inclination of the roof;

a recess formed in at least one of the projecting portions of the tile body;

a solar battery module placed in the recess, the recess including a bottom portion to be brought into contact with a reverse surface of the solar battery module, and at least one stop portion to be brought into contact with an edge portion of the solar battery module to hold it, the bottom portion being at a lower level than the projecting portions and at a higher level than the depressed portions; and an accommodating recess formed in the bottom portion of the recess for accommodating a terminal box projecting from a reverse surface of the solar battery module.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a perspective view showing an essential part of a first modification of the first embodiment;

FIG. 4 is a perspective view showing an essential part of a second modification of the first embodiment;

DETAILED DESCRIPTION OF THE INVENTION

The embodiments of the invention will be described in detail with reference to the accompanying drawings.

Figure 1:
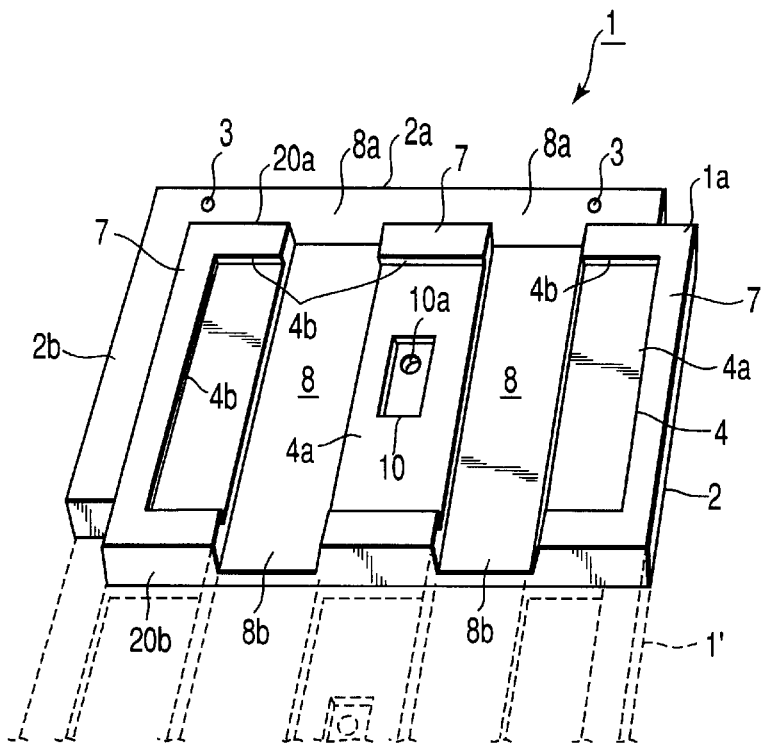
FIG. 1 is a schematic perspective view illustrating a tile for a solar battery module according to a first embodiment of the invention.
Figure 2:
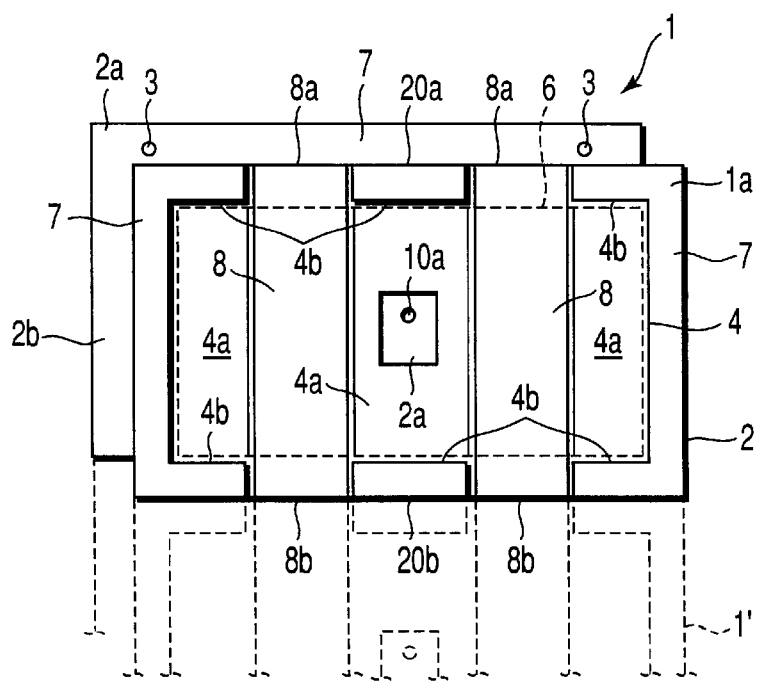
FIG. 2 is a plan view illustrating the tile of FIG. 1.

FIG. 1 is a schematic perspective view illustrating a tile 1 for a solar battery module according to a first embodiment of the invention, and FIG. 2 is a plan view of the tile 1, as viewed from the upper surface 1a side.

These figures show an example of a state in which upper and lower tiles 1 and 1' are aligned on the inclined roof of a house (not shown) in the direction of the inclination. The solid lines indicate the upper tile 1, and the broken lines indicate part of the lower tile 1'. Further, in FIG. 2, a solar battery module 6 is also indicated by the broken line, which is placed in a recess 4, described later, formed in the upper surface 1a of the tile 1.

As is shown in FIGS. 1 and 2, the tile 1 has a substantially rectangular tile body 2 formed of cement, clay, a synthetic resin, a metal, etc. The roof of a house is covered with such tiles 1, which are arranged in rows and columns along the slope of the roof, with respective substantially rectangular solar battery modules 6 fixedly received by respective recesses 4 as indicated by the broken line in FIG. 2. In other words, each tile is mounted as a tile-cum-solar battery module.

The upper surface 1a of the tile body 2 has a plurality of (three, in this embodiment) projecting portions 7 and a plurality of (two, in this embodiment) depressed portions 8, which alternately extend over the entire width of the tile body 2 in the direction of inclination of the roof (in the vertical direction in the figures). The projecting portions 7 have the same height, and the depressed portions 8 have the same depth. The bottom portions 4a of the recess 4 are at a lower level than the top of the projecting portions 7 and at a higher level than the bottom of the depressed portions 8.

The tile body 2 has overlap portions 2a and 2b that constitute upper and left portions in FIGS. 1 and 2, respectively, and are to be engaged with adjacent upper and left tile bodies 2. Two nail holes 3 for fixing the tile body 2 to a roofing board (not shown) are formed in the overlap portion 2a constituting an upper portion of the body 2.

The recess 4 is formed in the upper surface 1a of the tile body 2 so as to cut out part of at least one of the projecting portions 7. In this embodiment, all the three projecting portions 7 are partially cut out to form the substantially rectangular recess 4. The recess 4 is slightly deeper than the thickness of the solar battery module 6 described later, and has substantially the same size as the outer size of the substantially rectangular solar battery module 6. The solar battery module 6 is fixed to the recess 4 by, for example, an adhesive, so that its reverse surface contacts the bottom portions 4a of the recess 4. A plurality of stop portions 4b to be brought into contact with the four side surfaces of the solar battery module 6 are formed of side portions of the recess 4. The stop portions 4b prevent movement of the solar battery module 6 placed in the recess 4.

The depressed portions 8 are formed in the upper surface 1a of the tile body 2 at a lower level than and parallel to the three alternating potions 4a of the recess 4, and serve as drain passages 8 for guiding rainwater in the direction of inclination of the tile body 2. Each drain passage 8 has upper and lower ends 8a and 8b formed by partially cutting out the upper and lower ends 20a and 20b of the tile body 2 separated in the direction of inclination. Each drain passage 8 has substantially the same width as the projecting portions 7 and are at a lower level than the bottom 4a of the recess 4.

When a plurality of tile bodies 2 are aligned in the direction of inclination of a roof, the lower end 8b of the drain passage 8 of an upper-side tile body 2 is connected to the upper end 8a of the drain passage 8 of a lower-side tile body 2. As a result, the drain passages 8 are linearly connected to each other in the direction of inclination (see FIG. 1 or 2). In other words, a plurality of tile bodies 2 arranged on the entire roof provide a plurality of long drain passages 8 extending over the entire length thereof in the direction of inclination thereof. Accordingly, rainwater or meltwater collected on each solar battery module 6 and/or each tile body 2 is downwardly guided in the direction of inclination through the drain passages 8 extending over the entire length of the roof.

Further, a rectangular terminal box accommodating recess 10 (hereinafter referred to simply as "an accommodating recess 10") is provided in the bottom portion 4a of the recess 4, which is formed by cutting out part of the middle projecting portion 7 located between the two drain passages 8 in the upper surface 1a of the tile body 2. A cable leading hole 10a is formed in the bottom portion of the accommodating recess 10, which is slightly closer to the upper end of the tile body 2. The accommodating recess 10 accommodates a terminal box (not shown) provided on the reverse surface of the solar battery module 6 placed in the recess 4. An output extracting cable (not shown) is lead from the terminal box of the solar battery module 6, inserted through the cable leading hole 10a, and lead out to the reverse side of the tile body 2. The tile body 2 has no through holes other than the cable leading hole 10a.

The solar battery module 6 placed in the recess 4 of the tile body 2 is provided by, for example, forming a transparent electrode layer, an amorphous semiconductor layer and a reverse-side electrode layer on a glass substrate. The reverse side has a rectangular thin panel structure sealed by a sealing member to protect the semiconductor layer and the reverse-side electrode layer. The semiconductor layer is not limited to the amorphous semiconductor layer, but may be formed of monocrystalline, polycrystalline or crystallite silicon or any other appropriate compound.

A description will now be given of so-called tile roofing for constructing a roof using the above-described tiles cum solar battery modules.

A roofing board included in the roof of a house inclines downwardly from the ridge side to the eaves side. The tiles cum solar battery modules are mounted on the roofing board, directly or with a tile underlayer material interposed therebetween.

Like usual roofing using roof tiles without solar battery modules, tiles cum solar battery modules are mounted on the roofing board from the ridge side to the eaves side. Adjacent tile bodies 2 arranged in rows and columns along the slope of the roof have their overlap portions 2a and 2b engaged with each other, and are fixed to the roofing board by means of nails inserted through the nail holes 3 (see FIG. 1 or 3) formed in the upper overlap portions 2a.

By repeating the above operation, the roof is covered with the tiles cum solar battery modules. In parallel to the tile roofing operation, output extracting cables lead out from the terminal boxes of the solar battery modules and are connected in series or parallel to each other at the reverse side of the tile bodies 2. As a result, the solar battery modules 6 are electrically connected to each other.

In the tile 1 for a solar battery module, or a tile-cum-solar battery module (as shown in FIG. 2), almost all rainwater or meltwater collected on the solar battery module 6 and/or on the tile body 2 can be made to flow downward through the drain passages 8 connected in the direction of inclination of the roof below the reverse surfaces of the solar battery modules 6. In other words, since the drain passages 8 formed in the upper surface 1a of the tile bodies 2 have a greater depth than the bottom portions 4a of the recesses 4 that contain the solar battery modules 6, most rainwater can flow below the solar battery modules 6 without contacting them. Accordingly, the tile-cum-solar battery module according to this embodiment can reliably discharge rainwater without wetting the terminal box projecting from the reverse surface of each solar battery module 6, although it does not require, unlike the conventional case, caulking between the recess 4 and the solar battery module 6.

Moreover, since the drain passages 8 of the tile bodies 2 are connected to each other in the direction of inclination of the roof, rainwater is not collected between each tile body 2 and a roof board (not shown), with the result that the roofing board is free from damage such as corrosion due to rainwater.

In addition, although a plurality of relatively wide drain passages 8 are formed in the upper surface 1a of the tile body 2, the solar battery module 6 can be strongly fixed in the recess 4 of the body 2. This is because the area of the bottom portions 4a of the recess 4 to be made to contact the reverse surface of the solar battery module 6, i.e. the adhesion area, can be made relatively large, and the four side surfaces of the solar battery module 6 can reliably be held by the stop portions 4b that constitute edge portions of the recess 4.

FIG. 3 shows a first modification of the above-described first embodiment.

In the first modification, an annular groove 30 is formed in the middle bottom portion 4a of the recess 4 around the accommodating recess 10, for preventing water from entering the recess 10. Two drain grooves 31 extend from lower corners of the annular groove 30 in the direction of inclination, and reach the respective drain passages 8.

The annular groove 30 surrounding the accommodating recess 10 is more reliable in preventing rainwater from entering the recess 10. Even when rainwater has entered the annular groove 30, it flows into the drain passages 8 through the two drain grooves 31, thereby preventing rainwater from overflowing into the accommodating recess 10.

FIG. 4 shows a second modification of the above-described first embodiment.

In the second modification, an annular projection 40 is provided on the bottom portion 4a around the accommodating recess 10, for preventing water from entering the recess 10. The annular projection 40 surrounding the accommodating recess 10 is more reliable in preventing water from entering the recess 10.

Figure 5:
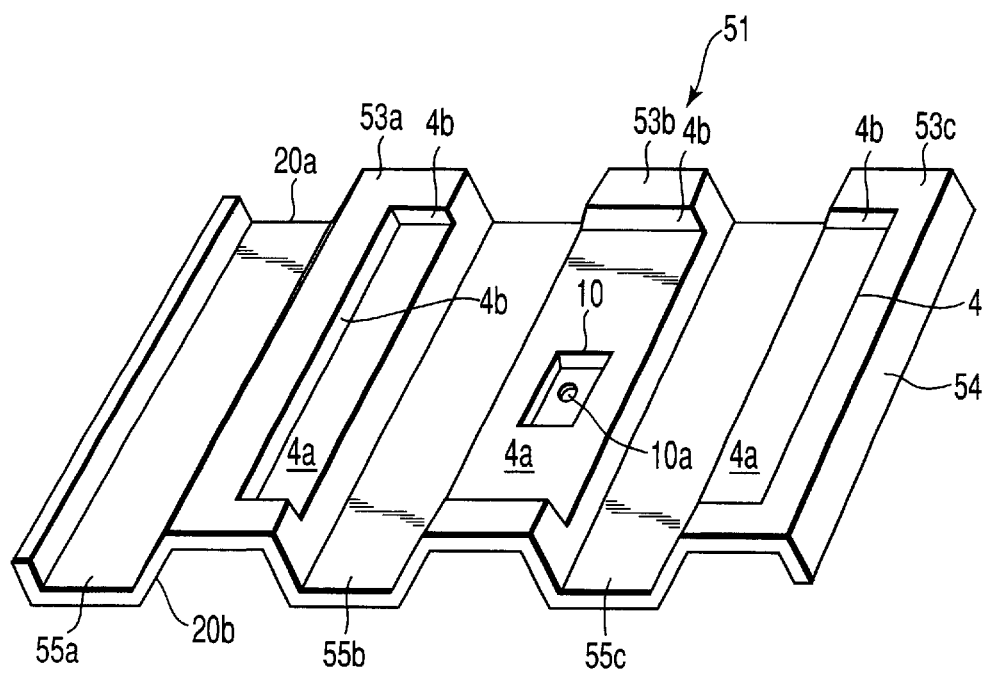
FIG. 5 is a schematic perspective view illustrating a tile for a solar battery module according to a second embodiment of the invention.
Figure 6:
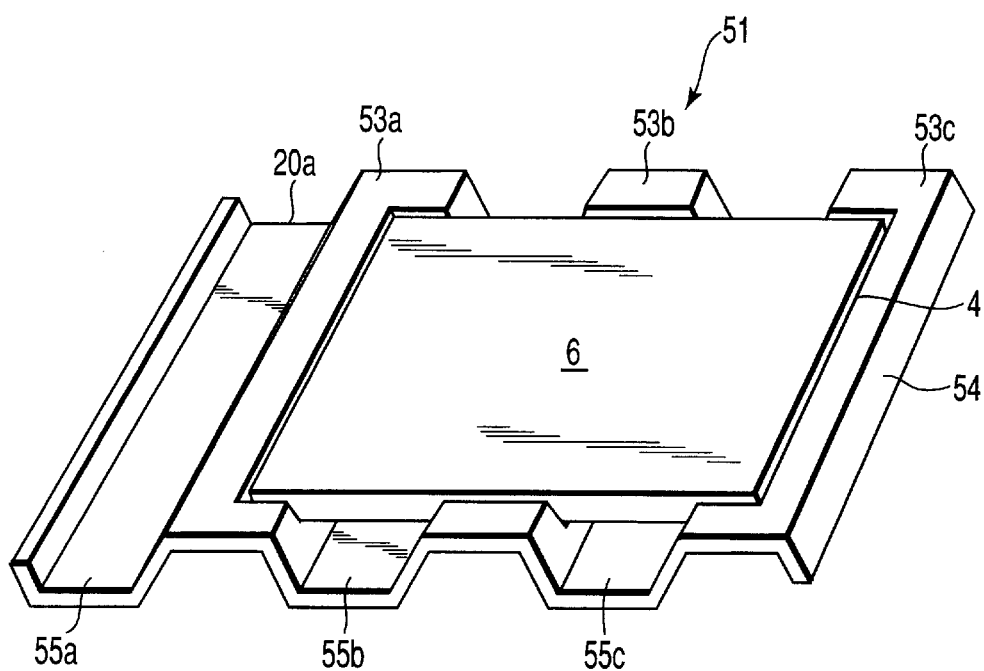
FIG. 6 is a perspective view showing a state in which a solar battery module is attached in a recess formed in the tile of FIG. 5.

Referring then to FIGS. 5 and 6, a tile for a solar battery module and a tile-cum-solar battery module, according to a second embodiment, will be described. In this embodiment, structural elements having the same functions as those employed in the first embodiment are denoted by corresponding reference numerals and not described in detail.

FIG. 5 is a schematic perspective view of a tile 51 for a solar battery module according to the second embodiment.

FIG. 6 shows a state in which a solar battery module 6 is mounted on the tile 51 (i.e. it shows a tile-cum-solar battery module).

As shown in FIG. 5, the tile 51 for a solar battery module is formed of, for example, a thick slate obtained by press-molding cement mortar. The tile 51 has a corrugated tile body 54 that includes three projecting portions 53a, 53b and 53c (hereinafter, it may be referred to as "projecting portions 55") and three depressed portions 55a, 55b and 55c (hereinafter, it may be referred to as "depressed portions 55"), which are alternately arranged parallel to each other. The projecting portions 53 have the same height, while the depressed portions 55 have the same depth.

A substantially rectangular recess 4 is formed in the upper surface of the tile body 54 for receiving the solar battery module 6. The recess 4 is formed by partially cutting out each of the three projecting portions 53a, 53b and 53c. The recess 4 has bottom portions 4a, to which the reverse surface of the solar battery module 6 is adhered, at a lower level than the projecting portions 53 and a higher level than the depressed portions 55. In this structure, rainwater flowing through each depressed portion 55 passes below the reverse surface of the solar battery module 6 in a position corresponding to the recess 4.

The tile body 54 accommodates the solar battery module 6 in the recess 4 as shown in FIG. 6. In the recess 4, the reverse surface of the solar battery module 6 is adhered to the bottom portions 4a by an adhesive. Such tile bodies 54 with respective solar battery modules 6 mounted thereon are arranged in rows and columns on an inclined roof of a house. More specifically, the tile bodies 54 are mounted on the roof so that the projecting portions 53 and the depressed portions 55 extend from the ridge side to the eaves side in the direction of inclination of the roof. The depressed portions 55 of the tile bodies 54, continuously extending in the direction of inclination, function as a continuous drain passage. Rainwater or meltwater collected on each solar battery module 6 and/or on each tile body 54 is discharged through the continuous drain passage formed of the depressed portions 55 of the tile bodies 54.

The recess 4 formed in the upper surface of each tile body 2 is slightly deeper than the thickness of the solar battery module 6, and has substantially the same size as the outer size of the module 6. Further, the recess 4 has a plurality of bottom portions 4a to be brought into contact with the reverse surface of the module 6, and a plurality of stop portions 6b to be brought into contact with the four side surfaces of the module 6 to hold them.

A rectangular terminal box accommodating recess 10 is provided in the bottom portion 4a of the recess 4, which is formed by cutting out part of the projecting portion 53b located at a substantially middle portion of the tile body 54. A cable leading hole 10a is formed in the bottom of the accommodating recess 10. The accommodating recess 10 accommodates a terminal box (not shown) provided on the reverse surface of the solar battery module 6 placed in the recess 4. An output extracting cable (not shown) is lead from the terminal box of the solar battery module 6, inserted through the cable leading hole 10a, and lead out to the reverse side of the tile body 54. The tile body 54 has no through holes other than the cable leading hole 10a.

As described above, this embodiment can provide the same advantage as the first embodiment, and also enables easy and cost-effective attachment of the solar battery module 6 to a relatively cheap corrugated slate without using any special attaching tool, thereby reducing the cost of roofing.

Moreover, when adhering the solar battery module 6 to the recess 4 of the tile body 54 by means of an adhesive, a double-sided tape may be used as temporary fixing means until the adhesive dries. When using the double-sided tape, it is wound around the accommodating recess 10, for example. In this case, the tape functions both as the temporary fixing means and as packing means for preventing water from entering the recess 10.

For example, a silicone-based adhesive, a silicon-based adhesive or an epoxy-based adhesive is used to adhere the solar battery module to the recess. In particular, it is desirable to use an elastic adhesive having elasticity even after it is hardened, such as the silicone-based adhesive or the silicon-based adhesive. This type of adhesive can absorb the difference between the thermal expansion coefficient of the tile body and that of the solar battery module, thereby maintaining adhesion therebetween at a high level for a long time. Further, a polyisobutylene-based adhesive containing silicon is known, for example, as a silicon-based adhesive.

Alternatively, any other appropriate fixing tool (not shown) may be used, instead of the adhesive and the double-sided tape, for fixing the solar battery module 6 to the recess 4 of the tile body 54.

Figure 7:
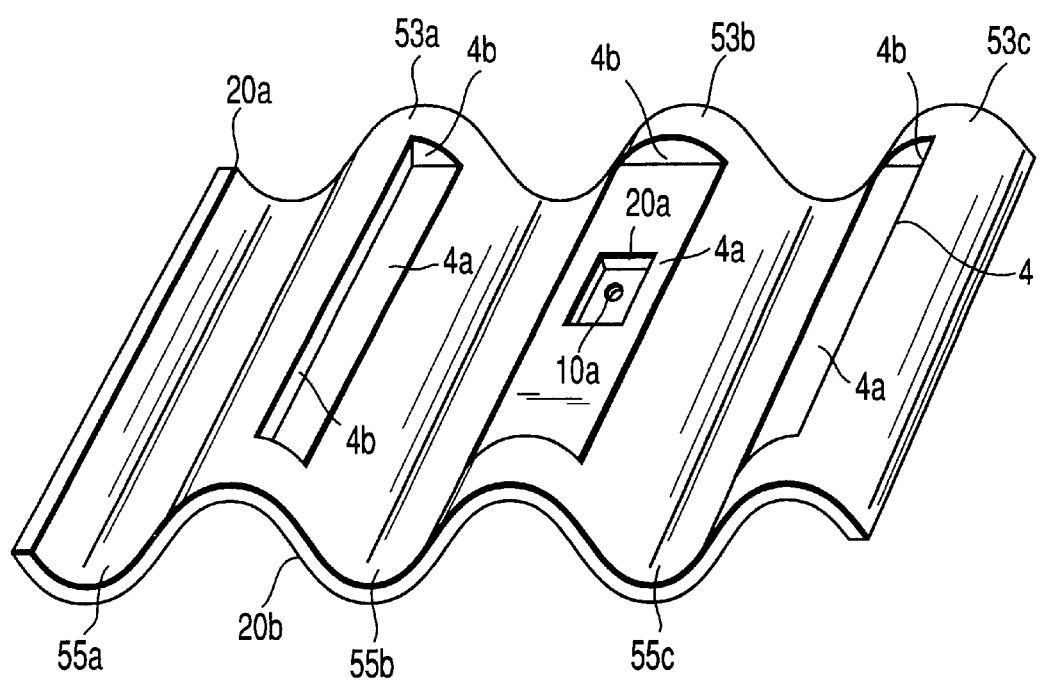
FIG. 7 is a perspective view showing a modification of the second embodiment.

FIG. 7 shows a modification of the above-described second embodiment. In this figure, the solar battery module 6 is not shown.

In this modification, the tile body 54 has three arcuate projecting portions 53*a*, 53*b* and 53*c* and three arcuate depressed portions 55*a*, 55*b* and 55*c*. Even when the shape of the projecting and/or the depressed portion is changed, the same advantage as the second embodiment can be obtained.

The present invention is not limited to the above-described embodiments, but may be modified in various ways without departing from its scope. Any of the above embodiments and modifications may be combined in an appropriate way. For example, the annular groove 30 shown in FIG. 3 or the annular projection 40 shown in FIG. 4 may be employed in the second embodiment. Further, the tile body 2 or 54 can be changed optionally in shape, size, material, etc. In addition, the number or the width of the drain passages 8 or 55 formed in the upper surface of the tile body 2 or 54 may be changed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A tile mounted on an inclined roof of a building, comprising:
    a tile body having a plurality of projecting portions and a plurality of depressed portions alternately extending over an entire length of the tile in a direction of inclination of the inclined roof; and
    a recess formed in at least one of the projecting portions of the tile body for receiving a solar battery module, the recess including a bottom portion to be brought into contact with a reverse surface of the solar battery module, and at least one stop portion to be brought into contact with an edge portion of the solar battery module to hold it, the bottom portion being at a lower level than the projecting portions and at a higher level than the depressed portions.

2. The tile according to claim 1, wherein an accommodating recess is formed in the bottom portion of the recess for accommodating a terminal box projecting from the reverse surface of the solar battery module.

3. The tile according to claim 2, wherein an annular groove is formed in the bottom portion of the recess around the accommodating recess to prevent water from entering the accommodating recess, the annular groove having a drain groove communicating with one of the depressed portions.

4. The tile according to claim 2, wherein an annular projection is formed on the bottom portion of the recess around the accommodating recess to prevent water from entering the accommodating recess.

5. The tile according to claim 1, wherein the solar battery module is formed of a substantially rectangular member having a thickness, and the recess has a plurality of stop portions for holding four sides of the solar battery module.

6. The tile according to claim 1, wherein the depressed portions serve as drain passages for downwardly discharging rainwater or meltwater, collected on the solar battery module and/or on the tile body, in the direction of inclination of the roof.

7. A tile mounted on an inclined roof of a building, comprising:
    a plurality of projecting portions extending over an entire length of the tile in a direction of inclination of the inclined roof;
    a plurality of depressed portions each interposed between each pair of adjacent ones of the projecting portions, the depressed portions each having opposite ends opening at an upper end and a lower end of the tile, the depressed portions serving as drain passages for downwardly discharging rainwater in the direction of inclination of the roof; and
    an accommodating recess formed in one of the projecting portions for accommodating a terminal box projecting from a reverse surface of the solar battery module.

8. The tile according to claim 7, wherein the accommodating recess has a bottom provided with a hole formed therein for guiding a cable, lead out from the terminal box of the solar battery module, to a reverse side of the tile.

9. The tile according to claim 7, wherein when a plurality of tiles are aligned on the roof in the direction of inclination, the lower end of each of the upper ones of the depressed portions is connected to the upper end of a corresponding one of the lower ones of the depressed portions, thereby providing a plurality of drain passages linearly connected in the direction of inclination.

10. The tile according to claim 7, wherein an annular groove is formed around the accommodating recess to prevent water from entering the accommodating recess, the annular groove having a drain groove communicating with one of the depressed portions.

11. The tile according to claim 7, wherein an annular projection is formed around the accommodating recess to prevent water from entering the accommodating recess.

12. A tile-cum-solar battery module mounted on an inclined roof of a building, comprising:
    a tile body having a plurality of projecting portions and a plurality of depressed portions alternately extending over an entire length of the tile in a direction of inclination of the inclined roof, the depressed portions each having opposite ends opening at an upper end and a lower end of the tile, the depressed portions serving as drain passages for downwardly discharging rainwater in the direction of inclination of the roof;

a recess formed in at least one of the projecting portions of the tile body;

a solar battery module placed in the recess, the recess including a bottom portion to be brought into contact with a reverse surface of the solar battery module, and at least one stop portion to be brought into contact with an edge portion of the solar battery module to hold it, the bottom portion being at a lower level than the projecting portions and at a higher level than the depressed portions; and an accommodating recess formed in the bottom portion of the recess for accommodating a terminal box projecting from the reverse surface of the solar battery module.

13. The tile-cum-solar battery module according to claim 12, wherein an annular groove is formed in the bottom portion of the recess around the accommodating recess to prevent water from entering the accommodating recess, the annular groove having a drain groove communicating with one of the depressed portions.

14. The tile-cum-solar battery module according to claim 12, wherein an annular projection is formed on the bottom portion of the recess around the accommodating recess to prevent water from entering the accommodating recess.

15. The tile-cum-solar battery module according to claim 12, wherein the solar battery module is formed of a substantially rectangular member having a thickness, and the recess has a plurality of stop portions for holding four sides of the solar battery module.

16. The tile-cum-solar battery module according to claim 12, wherein the accommodating recess has a bottom provided with a hole formed therein for guiding a cable, lead out from the terminal box of the solar battery module, to a reverse side of the tile.

17. The tile-cum-solar battery module according to claim 12, wherein when a plurality of tiles are aligned on the roof in the direction of inclination, the lower end of each of the upper ones of the depressed portions is connected to the upper end of a corresponding one of the lower ones of the depressed portions, thereby providing a plurality of drain passages linearly connected in the direction of inclination.

* * * * *